United States Patent [19]

Blazic et al.

[11] Patent Number: 5,375,471
[45] Date of Patent: Dec. 27, 1994

[54] CONFORMAL CIRCUIT WITH HARSH ENVIRONMENT ISOLATION MATERIALS

[75] Inventors: Ernest S. Blazic, Hawthorne; Joseph P. Smalanskas, Westchester, both of Calif.

[73] Assignee: Hughes Aircraft Company, Los Angeles, Calif.

[21] Appl. No.: 906,594

[22] Filed: Jun. 30, 1992

Related U.S. Application Data

[63] Continuation-in-part of Ser. No. 738,389, Jul. 31, 1991, Pat. No. 5,184,516.

[51] Int. Cl.$^5$ .................................................. G01B 7/16
[52] U.S. Cl. ........................................... 73/767; 73/775
[58] Field of Search .................. 73/799, 775, 767, 763, 73/769, 772, 781

[56] References Cited

U.S. PATENT DOCUMENTS

| | | | |
|---|---|---|---|
| 4,546,652 | 10/1985 | Virkar et al. | 73/799 X |
| 4,835,466 | 5/1989 | Maly et al. | 324/718 X |
| 5,086,652 | 2/1992 | Kropp | 73/767 |

Primary Examiner—Jerry W. Myracle
Attorney, Agent, or Firm—Leonard A. Alkov; W. K. Denson-Low

[57] ABSTRACT

A multilayer flexible circuit for sensing physical properties of a structural surface 12 capable of surviving exposure in harsh environments through the use of isolation materials 70 disposed within the flexible circuit 10.

12 Claims, 2 Drawing Sheets

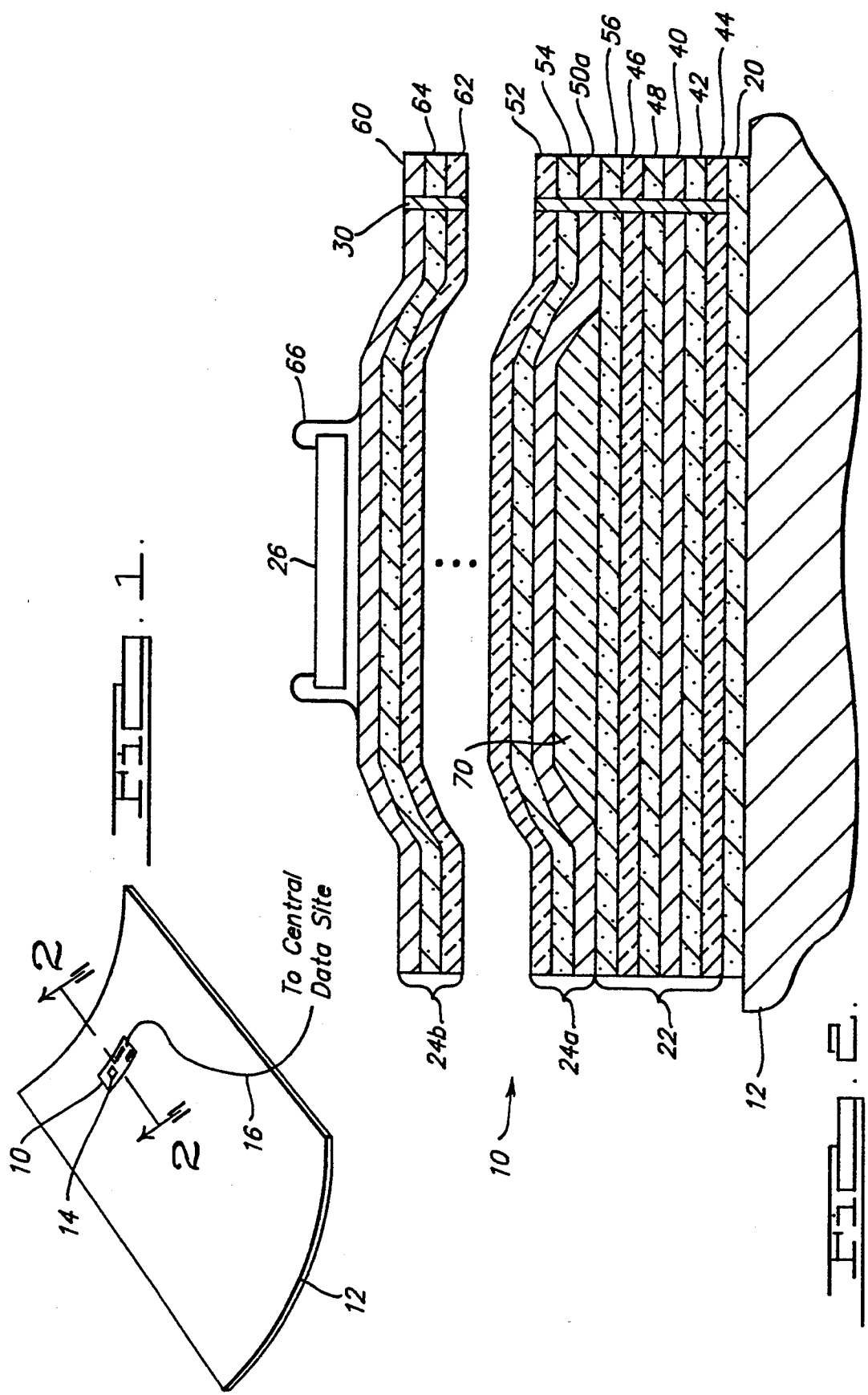

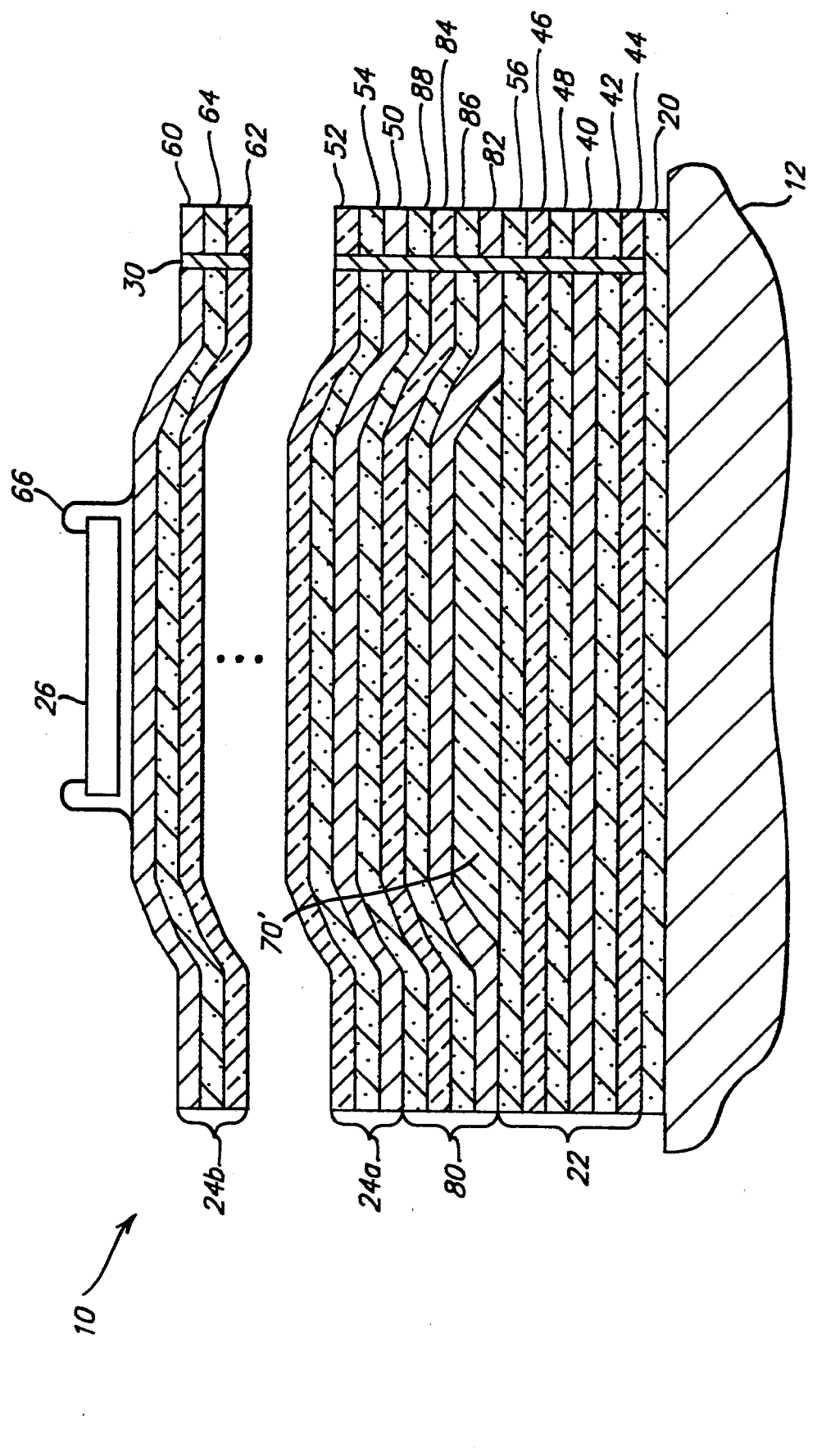

CONFORMAL CIRCUIT WITH HARSH ENVIRONMENT ISOLATION MATERIALS

CROSS REFERENCE TO RELATED APPLICATIONS

This application is a continuation-in-part of U.S. application Ser. No. 07/738,389 now U.S. Pat. No. 5,184,516 filed Jul. 31, 1991 by inventor E. S. Blazic, "Large Area Strain and Crack Gauge Flexible Circuit", assigned to the assignee of this application, which is hereby incorporated by reference.

BACKGROUND OF THE INVENTION

1. Field of the Invention

This invention relates generally to the field of flexible circuits, and more particularly to employing flexible circuits to monitor structural health where the structure is subjected to a harsh environment.

2. Description of Related Art

Flexible circuits are circuits designed from very thin layers of flexible metals and other compositions, where the layers include conductive and non-conductive portions creating electrical circuits. As the name implies, flexible circuits are capable of being flexed, and as such flexible circuits can be employed in a variety of applications where a conventional rigid circuit would not be suitable. For example, flexible circuits can be mounted to surfaces having three dimensional curvatures. These flexible circuits are easily mounted to curved surfaces through the use of common adhesives such as epoxy. Such features make flexible circuits ideally suited to monitoring the structural health of a surface of a structure.

A structure, such as an aircraft or bridge, encounters a variety of influences during their service life that can affect the integrity of that structure. Heat and cold can change the properties of metals, and vibrations, strain and loading can induce fatigue stress cracks. Normally, such defects would have to be detected during service operations. However, because many defects may exist without being visible, service inspections do not provide the most reliable means for detecting defects. And although devices exist that can detect these minute defects, such devices typically require lengthy out-of-service intervals while the monitoring devices are deployed over the structure and necessary laboratory-like circumstances are enforced. Moreover, these monitoring devices, such as x-rays, may not be able to be placed in the confined areas of the structure desired to be monitored. Therefore, flexible circuits provide a distinct advantage over other monitoring techniques because they can be placed at practically any point on the structure.

However, because flexible circuits are designed to be mounted to the structure, the flexible circuits are subjected to the same harsh environment to which the structure is subjected. This is disadvantageous, because flexible circuits often contain fragile electronic components not rugged enough to survive in harsh environments. Thus, any advantage gained by deploying flexible monitoring circuits over a structure can be lost if the flexible circuit fails while in-service due to having been exposed to an overly harsh environment. Therefore, it would be advantageous to provide for a flexible circuit which can be employed for structural health monitoring without being susceptible to failure due to being exposed to harsh environments.

SUMMARY

It is therefore an object of the present invention to provide for a multilayer flexible circuit for sensing the physical properties of a structural surface. The flexible circuit includes sensor layers, attached to the structural surface, for sensing the physical properties and for generating a signal in response to the sensed physical properties. An integrated circuit analyzes the signal, and signal interconnect layers interface between the integrated circuit and the sensor layers. In order to employ the flexible circuit on structures operating in harsh environments, isolating means are embedded between the sensor layers and integrated circuit so as to protect the integrated circuit from being harmed by the adverse physical events associated with the harsh environment, thereby protecting the integrated circuit from experiencing degradation.

BRIEF DESCRIPTION OF THE DRAWINGS

The various advantages of the present invention can be better appreciated by reference to the detailed description of the preferred embodiment in conjunction with the drawings in which:

FIG. I is a perspective view showing the placement of a flexible circuit on a structure;

FIG. 2 is a sectional view taken along the lines 2-2 of FIG. I detailing the composition of the flexible circuit in an embodiment utilizing passive embedded material; and FIG. 3 is a sectional view of the flexible circuit detailing the composition of the circuit in an alternative embodiment utilizing active embedded materials.

DETAILED DESCRIPTION OF THE PREFERRED EMBODIMENT

As was mentioned earlier, flexible circuits are ideally suited to monitor the health of a structure while it is in service. In the exemplar depicted in FIG. 1, a flexible circuit, generally indicated at 10, is attached to the curved surface of a structure, such as an airplane wing, generally indicated at 12. The flexible circuit contains sensor and analysis circuitry, generally indicated at 14, which monitors the physical characteristics of the structure 12 such as heat, stress and strain loading, and electrical discharges, and relays this information to a central data site via interconnect wiring 16.

As can be seen in FIG. 2, the flexible circuit 10 is attached to the structure 12 using a structural adhesive 20 such as epoxy. The flexible circuit 10 itself is made of multiple layers of metallic, dielectric and adhesive layers. The sensor layers 22 are in the closest proximity to the structure, with the various signal interconnect layers 24a,b on top of the sensor layers 22. An integrated circuit 26 is provided on the top of the flexible circuit. This integrated circuit 26 is electrically connected to the sensor layers 22 by way of a multi-layer flexible interconnect via 30. It should be appreciated that the integrated circuit 26, signal interconnect layers 24a,b and sensor layers 22 can also be interconnected by other means such as wire bonding, insulated connectors, shielded connectors, plated through-hole vias, plated blind-hole vias, tape automated bonding, solder or conductive epoxy. The particular interconnect means used, of course, can be adapted to best suit the particular application.

The sensor layers 22 are constructed of a sensor metallization layer 40 bonded by a structural adhesive 42 to a first flexible dielectric layer 44. This portion of the sensor layers 22 utilizes structural adhesive 42 between the metallization 40 and first dielectric 44 layers, as well as a structural adhesive 20 bonding the first dielectric 44 to the structure 12, to allow the sensor layers 22 to experience essentially the same physical phenomena experienced by the structure 12. Thus, any stress or strain, heat or cold, or other physical phenomenon endured by the structure will be transmitted and sensed by the first dielectric 44 and metallization 40 layers of the sensor layers 22. As a result, the metallization layer 40 generates a signal to indicate any changes in these experienced phenomena. For example, an increase in heat of the structure 12 would result in an increase in resistance of the sensor layer metallization 40. The metallization layer 40 of the sensor layers 22 is interfaced to the signal interconnect layers 24 via a second flexible dielectric layer 46 and nonstructural adhesive 48.

The upper layers of the flexible circuit are made up of the signal interconnect layers 24a,b. The signal interconnect layers consist of alternating layers of metallization 50 and dielectric material 52 bonded by non-structural adhesive 54. As shown in FIG. 2, there is an intermediate signal interconnect metallization layer 50a bonded to the sensor layers 22 by way of a non-structural adhesive 56. Although not specifically shown in this embodiment, it should be appreciated that there can be additional intermediate signal interconnect layers including metallization layers bonded to dielectric layers by non-structural adhesives. The top signal interconnect layer 24b is similarly constructed of a metallization layer 60 and dielectric layer 62 bonded by a non-structural adhesive 64. However, for the top signal interconnect layer 24b, the metallization layer is the top layer, rather than being the lower layer as found in the intermediate signal interconnect layers 24a. Providing a metallization layer 60 as the uppermost layer of the top signal interconnect layer 24b allows the integrated circuit 26 to be attached to the flexible circuit 10 by way of wire bond or TAB interconnects 66.

As can be seen in FIG. 2, temperature and vibrational isolation for the integrated circuit 26 is provided by way of embedded materials 70 lying in a pocket between the lowermost intermediate signal interconnect layer 24a and the sensor layers 22. This layer of embedded materials 70 helps prevent the transmission of adverse environmental phenomena through the sensor layers 22 to the signal layers 24a,b and integrated circuit 26. While in this preferred embodiment the embedded materials 70 takes the form of Nomex thermal insulating felt, it should be appreciated that a number of other passive isolating materials could be utilized such as trapped gas or liquid, gel encapsulates or silicone gel. Since the flexible circuit of the presently preferred embodiment is designed to be deployed over a structure operating in a harsh environment, the embedded materials 70 attenuate undue strain, dampen vibrations, and/or insulate from extreme temperatures. As such, regardless of the particular isolating material selected, the passive isolating embedded materials 70 are an effective means for protecting the integrated circuit 26 from degradation due to structural vibrations or temperature changes being transmitted from the structure 12 through the sensor layers 22 to the integrated circuit 26. While the non-structural adhesives in the flexible circuit provide some degree of strain and vibration attenuation and temperature isolation, they do not sufficiently protect the integrated circuit to prevent its performance from degrading. As such, the embedded materials 70 are a uniquely effective means for extending the service life of the integrated circuit by better protecting it from these adverse physical phenomena.

In an alternative embodiment depicted in FIG. 3, the embedded materials 70' are made up of active isolating materials. Such active materials can provide capabilities such as sensor feedback, thermoelectric cooling, or thermoelectric heating. As such, the active embedded materials 70 in this alternative embodiment are made of piezoelectric crystals. It should be appreciated that other active materials could be employed, such as piezoelectric polymers. If active isolating embedded materials 70' are selected for use, as is illustrated in FIG. 3, an embedded materials interconnect layer 80 is required. The embedded material interconnect layer 80 lies above the sensor layers 22 and below the lowermost intermediate signal interconnect layers 24a. More particularly, the embedded materials interconnect layers 80 include an embedded materials metallization layer 82 bonded to an embedded materials flexible dielectric layer 84 by a nonstructural adhesive 86. Furthermore, the embedded materials interconnect layer 80 is bonded above to the intermediate signal interconnect layer 24a and below to the sensor layers 22 by way of non-structural adhesives 88, 56, respectively, and further is interconnected to the integrated circuit 26 and other layers 22, 24a,b by way of the multi-layer flex interconnect via 30. The active embedded materials 70' are disposed in a pocket between the embedded materials interconnect layer 80 and the sensor layers 22.

In operation, the embedded materials, either passive 70 or active 70', effectively isolate the integrated circuit from being unduly subjected to the adverse physical phenomena experienced by the structure while still allowing the sensor layers 22 to effectively sense and monitor the structure's reactions to these physical phenomena. This improves the robustness of the flexible circuit and expands the range of suitable uses, allowing flexible circuits to be employed over a greater diversity of applications for a longer degree of time.

It should be appreciated that the foregoing description of the presently preferred embodiment and alternative embodiment provided herein was for the purposes of illustration, and modifications could be exercised by those of ordinary skill in the art without departing from the spirit or scope of the invention disclosed herein.

What is claimed is:

1. A multilayer flexible circuit for sensing physical properties of a structural surface, said multilayer flexible circuit comprising:

sensor layers, attached to said structural surface, for sensing said physical properties and for generating a signal in response to said sensed physical properties;

an integrated circuit for analyzing said signal;

signal interconnect layers disposed between said integrated circuit and said sensor layers for interconnecting said signal from said sensor layers to said integrated circuit; and isolating means, embedded between said sensor layers and said integrated circuit, for protecting said integrated circuit from being harmed by adverse physical events endured by said structural surface;

whereby said multilayer flexible circuit can be employed to monitor the physical properties of structural surfaces operating in harsh environments without experiencing degradation of said integrated circuit.

2. The multilayer flexible circuit of claim 1 wherein said isolating means comprises passive isolating materials.

3. The multilayer flexible circuit of claim 2 wherein said passive isolating materials are selected from the group of thermal insulating feet, trapped gas, trapped liquid or gel encapsulant.

4. The multilayer flexible circuit of claim 1 wherein said isolating means comprises active isolating materials and wherein said flexible circuit further comprises embedded materials interconnect layers disposed between said active isolating materials and said signal interconnect layers for interconnecting said active isolating materials to said integrated circuit.

5. The multilayer flexible circuit of claim 4 wherein said active isolating materials are selected from the group of piezoelectric polymers or piezoelectric crystals having sensor feedback, thermal electric cooling or thermal electric heating properties.

6. The multilayer flexible circuit of claim 4 wherein said signal interconnect layers include at least one intermediate signal interconnect layer and a top signal interconnect layer and wherein said sensor layers, said embedded material interconnect layers and said signal interconnect layers are comprised of:

a first sensor dielectric layer, attached to said surface with a structural adhesive;

a sensor metallization layer, attached to said first sensor dielectric layer with a structural adhesive;

a second sensor dielectric layer, attached to said sensor metallization layer with a non-structural adhesive;

an embedded materials interconnect metallization layer, attached to said second sensor dielectric layer with a non-structural adhesive, said embedded materials disposed in a pocket formed between said embedded materials interconnect metallization layer and said second sensor dielectric layer;

an embedded materials interconnect dielectric layer, attached to said embedded materials interconnect metallization layer with a non-structural adhesive;

an intermediate signal interconnect metallization layer, attached to said embedded materials interconnect dielectric layer with a non-structural adhesive;

an intermediate signal interconnect dielectric layer, attached to said intermediate signal interconnect metallization layer with a non-structural adhesive;

a top signal interconnect metallization layer, attached to said intermediate signal interconnect dielectric layer with a non-structural adhesive; and circuit attachment means for attaching said integrated circuit to said top signal interconnect metallization layer.

7. The multilayer flexible circuit of claim 1 wherein said signal interconnect layers include at least one intermediate signal interconnect layer and a top signal interconnect layer, and wherein said sensor layers and said signal interconnect layers are comprised of:

a first sensor dielectric layer, attached to said surface with a structural adhesive;

a sensor metallization layer, attached to said first sensor dielectric layer with a structural adhesive;

a second sensor dielectric layer, attached to said sensor metallization layer with a non-structural adhesive;

an intermediate signal interconnect metallization layer, attached to said second sensor dielectric layer with a non-structural adhesive, said isolation means being disposed in a pocket formed between said intermediate signal interconnect metallization layer and said second sensor dielectric layer;

an intermediate signal interconnect dielectric layer, attached to said intermediate signal interconnect metallization layer with a non-structural adhesive;

a top signal interconnect metallization layer, attached to said intermediate signal interconnect dielectric layer with a non-structural adhesive; and circuit attachment means for attaching said integrated circuit to said top signal interconnect metallization layer.

8. The multilayer flexible circuit of claim 7 further including layer interconnecting means interconnecting said top signal interconnect layer, said intermediate signal interconnect layer and said sensor layer.

9. The multilayer flexible circuit of claim 8 further including multilayer interconnect means interconnecting said top signal interconnect layer, said intermediate signal interconnect layer, said embedded materials interconnect layer and said sensor layer.

10. A multilayer flexible circuit for sensing physical properties of a structural surface, said multilayer flexible circuit comprising:

sensor layers, attached to said structural surface, for sensing said physical properties and for generating a signal in response to said sensed physical properties;

signal interconnect layers disposed above said sensor layers;

an integrated circuit, disposed above said signal interconnect layers, wherein said signal is transmitted to said integrated circuit from said sensor layers by said signal interconnect layers and wherein said integrated circuit analyzes said signal; and passive isolating materials, embedded between said sensor layers and said signal interconnect layers, for protecting said integrated circuit from being harmed by adverse physical events endured by said structure, whereby said multilayer flexible circuit can be employed to monitor the physical properties of structural surfaces operating in harsh environments without experiencing degradation of said integrated circuit.

11. A multilayer flexible circuit for sensing physical properties of a structural surface, said multilayer flexible circuit comprising:

sensor layers, attached to said structural surface, for sensing said physical properties and for generating a signal in response to said sensed physical properties;

signal interconnect layers, disposed above said sensor layers;

an integrated circuit, disposed above said signal interconnect layers, wherein said signal is transmitted to said integrated circuit by said signal interconnect layers, and wherein said integrated circuit analyzes said signal;

active isolating materials interconnect layers, disposed between said sensor layers and said signal interconnect layers, and active isolating materials disposed in a pocket formed between said active isolating materials interconnect layers and said sensor layers where said active isolating materials protect said integrated circuit from being harmed by adverse physical events endured by said structural surface, whereby said multilayer flexible circuit can be employed to monitor the physical properties of structural surfaces operating in harsh environments without experiencing degradation of said integrated circuit.

12. A method for sensing physical properties of a structural surface operating in a harsh environment, said method including:

layering sensor layers beneath signal interconnect layers beneath an integrated circuit such that at least one of said signal interconnect layers contact said integrated circuit;

attaching said sensor layers to said structure;

sensing said physical properties of said structure with said sensor layers and generating a signal in response to said sensed physical properties;

transmitting said signal from said sensor layers to said integrated circuit through said signal interconnect layers; and isolating said integrated circuit from harsh physical conditions by forming a pocket between said sensor layers and said signal interconnect layers with isolating means disposed within said pocket for attenuating undue phenomena such that said integrated circuit is able to operate in a harsh environment without experiencing degradation.

* * * * *